United States Patent [19]

Dydyk

[11] 4,034,314

[45] July 5, 1977

[54] MICROWAVE DIODE COAXIAL CIRCUIT OSCILLATOR IMPROVEMENT

[75] Inventor: Michael Dydyk, Scottsdale, Ariz.

[73] Assignee: Motorola, Inc., Schaumburg, Ill.

[22] Filed: June 24, 1976

[21] Appl. No.: 699,722

[52] U.S. Cl. .................................. 331/101; 331/56; 331/107 R

[51] Int. Cl.² .......................................... H03B 7/14

[58] Field of Search ............... 330/56; 331/101, 56, 331/96, 107 R, 107 G, 107 T

[56] References Cited

UNITED STATES PATENTS

| | | | |
|---|---|---|---|
| 3,534,293 | 10/1970 | Harkless | 331/96 |
| 3,626,327 | 12/1971 | Luchsinger | 331/96 |
| 3,628,171 | 12/1971 | Kurokawa et al. | 331/56 |
| 3,743,966 | 7/1973 | Grace et al. | 331/101 |
| 3,882,411 | 5/1975 | Ashida et al. | 330/56 |
| 3,931,587 | 1/1976 | Harp et al. | 331/101 |
| 3,984,788 | 10/1976 | Peyrat | 331/101 |

*Primary Examiner*—John Kominski
*Attorney, Agent, or Firm*—M. David Shapiro

[57] ABSTRACT

An improvement in a prior art microwave diode coaxial oscillator circuit comprising an unloaded fundamental frequency cavity for prevention of energy loss in the matching termination at the resonant frequency of the circuit and a second harmonic resonant cavity for controlling second harmonic loading of the diode and for reducing noise in the output signal.

6 Claims, 5 Drawing Figures

MICROWAVE DIODE COAXIAL CIRCUIT OSCILLATOR IMPROVEMENT

FIELD OF THE INVENTION

The invention relates to an improvement of a prior art microwave diode coaxial oscillator circuit, the improvement comprising the addition of a fundamental frequency cavity and a second harmonic frequency cavity.

BACKGROUND OF THE INVENTION

Microwave circuits for accumulating power output from multiple negative resistance diode oscillators are well known in the art, for example, the patents of Kurokawa et al, U.S. Pat. No. 3,628,171 and Harp et al, "Power Combining of X-Band IMPATT Circuit Modules," 1973, IEEE International Solid-State Circuits Conference, pp 118–119, show such devices. The general device type utilizes a negative resistance diode oscillator in one end of a coaxial microwave circuit. The coaxial circuit includes a transformer for matching the diode to the characteristic impedance of the coaxial line and a matched load resistance at the end opposite the diode for stabilization of the diode. The coaxial line may be coupled to a resonant cavity at a point intermediate to the diode and the matched load. This cavity may be used to accumulate power from several diodes, each mounted in its own coaxial circuit. The RF energy may then be taken by means of a probe inserted into the resonant cavity.

These circuits typically suffer from several disadvantages; for example, the output efficiency depends upon the ratio of the real part of the input impedance looking into the resonant cavity and the value of the terminating matched resistance. This efficiency improves with an increasing ratio. The maximum real input impedance of the resonant cavity occurs at the resonant frequency and decreases rapidly, with a change in frequency since the cavity is of high Q construction. This means that in order to obtain maximum efficiency the diode has to be made resonant by the coaxial circuit external to the resonant cavity. In theory this can be done, but, in practice it becomes very difficult. Further, if it is necessary to combine several diodes, each diode has to undergo a tedious optimization process since no two microwave semiconductor diodes are alike.

Further, these circuits make no provision for controlling second harmonic loading. Such control is essential for more efficient output power and for reduced noise level operation. Still further, the circuits will suffer in efficiency when attempts are made to tune them.

SUMMARY OF THE INVENTION

The foregoing and other shortcomings and problems of the prior art are overcome, in accordance with the present invention, by utilizing a second fundamental frequency cavity which is unloaded and spaced an integral multiple of quarter wavelengths (at resonant frequency, $f_0$) from the accumulator resonant cavity, as measured along the axis of the coaxial circuit, and still another unloaded cavity having a resonant frequency of $2f_0$ being located an integral multiple (odd or even) of one-eighth wavelengths of resonant frequency, $f_0$, from the diode. The unloaded cavity of resonant frequency $f_0$ is utilized to prevent loss of power in the terminating matching resistance at the resonant frequency, $f_0$. The second unloaded cavity having a resonant frequency of $2f_0$ is employed to provide a short or an open circuit at the diode terminals at the second harmonic frequency, $2f_0$.

According to one aspect of the present invention a fundamental frequency cavity is utilized to prevent absorbtion of microwave energy by the terminating matching load at the fundamental frequency.

According to another aspect of the invention a cavity having a resonant frequency of two times the desired resonant frequency of the circuit is utilized to effectively provide short or open circuited diode terminals to provide control of second harmonic loading and to reduce noise from the oscillator.

According to still another aspect of the invention, an unloaded cavity at the desired resonant frequency of the circuit is employed to prevent absorbtion of desired output microwave energy by the terminating resistor and a second cavity having a resonant frequency twice the desired resonant frequency of the circuit is employed to control second harmonic loading of the diode. These cavities provide independent control of the fundamental and second harmonic frequencies in the microwave circuit since the cavities are decoupled from one another.

The foregoing and other aspects of the present invention will be understood more fully from the following detailed description of an illustrative embodiment of the present invention in conjunction with accompanying drawings in which.

DETAILED DESCRIPTION OF THE INVENTION

Figure 1:
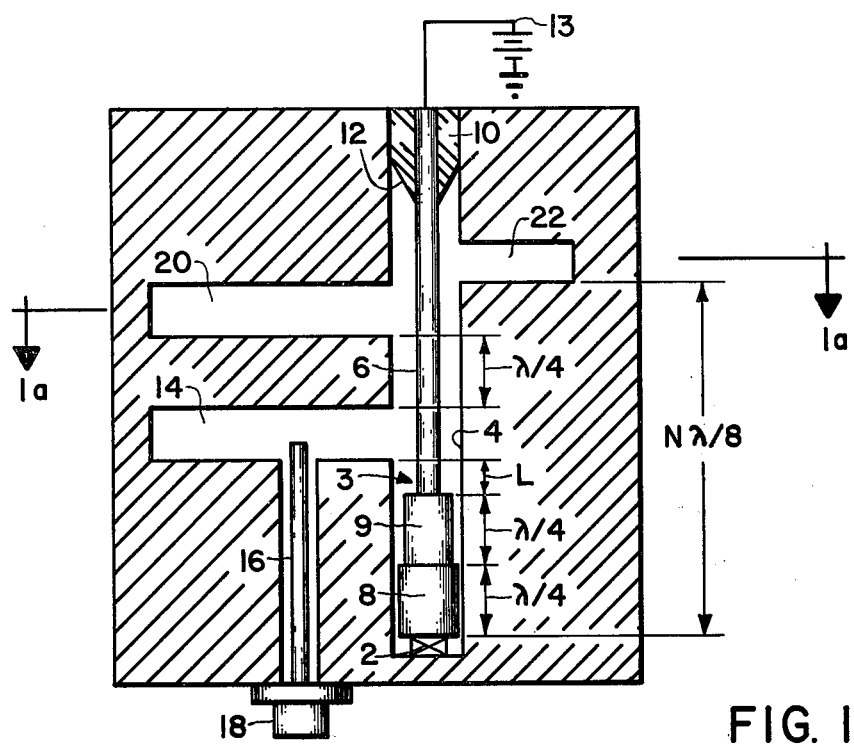
FIG. 1 is illustrative of the device of the invention utilizing a single diode coaxial circuit, FIG. 1a being a cross-sectional view of FIG. 1 illustrating the relative positions of the cavities of the improvement of the invention.
Figure 1A:
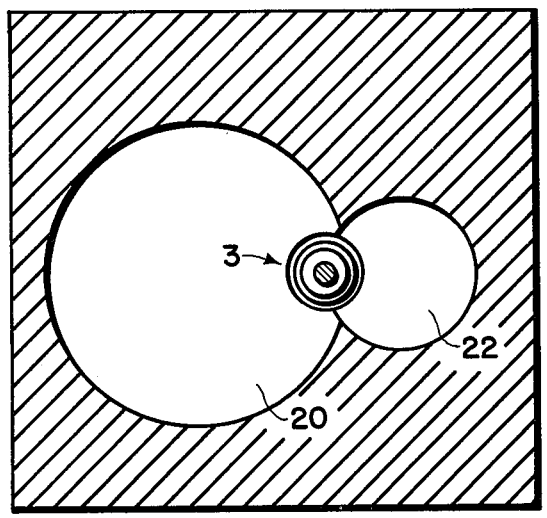

FIG. 1 is illustrative of one embodiment of the present invention. It should be noted that where like reference numerals are utilized in the Figures, the elements so numbered serve similar or identical purposes.

The device of FIG. 1 utilizes diode 2 at one end of coaxial circuit 3. Center conductor 6 of coaxial circuit 3 employs two transformers, 8, 9 adjacent diode 2. Transformer 8 has impedance $z_{t1}$ and is one-quarter wavelength long at resonant frequency $f_0$. Transformer 9, adjacent transformer 8, has impedance $Z_{t2}$ and is also one-quarter wave long at frequency $f_0$. The spacing between diode 2 and cavity 14 includes dimension L which, together with transformers 8 and 9, provide the impedance required for optimum performance by diode 2.

Matching load termination 10 having tapered entry 12 is utilized to stabilize diode 2, as is well known in the art. Bias power supply 13 supplies bias current to diode 2, also as in prior art devices. Probe 16 and output connector 18 are used to couple output power from cavity 14, again as is accomplished in prior art devices.

The improvements of the present invention over the prior art are shown in FIG. 1 as follows:

Cavity 20 having a resonant frequency, $f_0$, is coupled to coaxial circuit 3 and is positioned parallel to cavity 14 and coupled to coaxial circuit 3 at a point one-quarter wavelength (at $f_0$) from cavity 14. Cavity 22 being self resonant at a frequency of $2f_0$ is coupled to coaxial circuit 3 at a point N times $\lambda/8$ (at $f_0$), from diode 2 (where N is equal to any integer and $\lambda$ is the wavelength at frequency $f_0$).

To simply increase the output power of the diode an open or a short circuit at the second harmonic at diode 2 terminals would be adequate. To reduce the noise level at fundamental frequency, $f_0$, it is necessary to control the phase of the impedance at the second harmonic frequency. Therefore, second harmonic cavity 22 might have to be detuned slightly from $2f_0$.

Cavities 20, 22 are unloaded, that is, no output power is supplied therefrom. Therefore, cavities 20, 22 have a very high Q, as will be well understood by one skilled in the microwave art.

Cavity 20 presents a very high impedance in series with matching load termination 10 at resonant frequency $f_0$. This very high impedance is reflected to the coupling point of cavity 14 with coaxial circuit 3 as a short circuit in series with cavity 14 across coaxial circuit 3. This means that at resonant frequency $f_0$, matching load termination 10 is effectively not seen by the microwave energy developed in the circuit. Therefore, very little of the energy generated at frequency $f_0$ is absorbed by matching load termination 10. Since there is little energy loss at $f_0$ in matching load termination 10, this means that a higher percentage of the total generated energy at frequency $f_0$ is available for coupling through probe 16 to output connector 18 thereby providing an apparatus with efficiency improved over that of the prior art.

Figure 2:
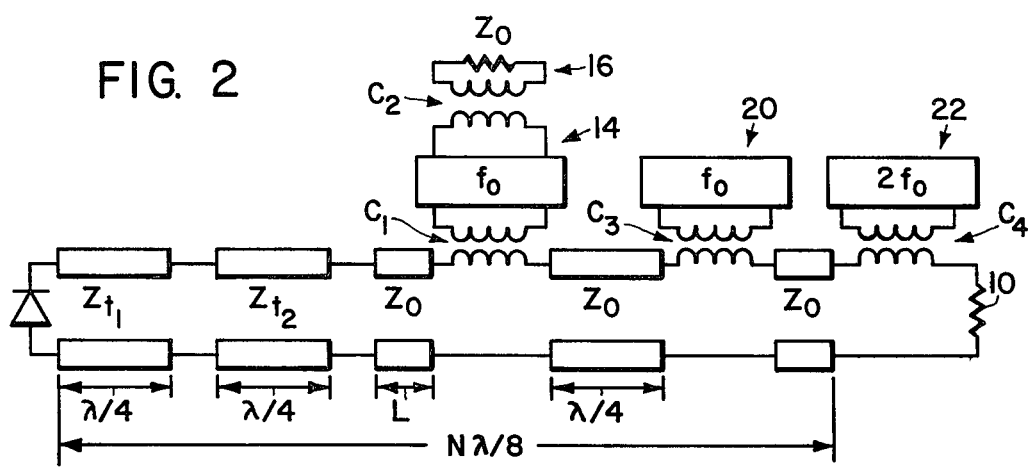
FIG. 2 is a diagramatic representation of the device of FIG. 1.

Cavity 22, being resonant at twice the system operating frequency, $2f_0$, presents a very high impedance in series with terminating matching load 10 at $2f_0$. Noting that cavity 22 is located an integral number of $\lambda/8$ lengths (at $f_0$) from diode 2 it will be recognized that $\lambda/8$ (at $f_0$) is one-quarter wavelength at frequency $2f_0$. Each quarter wavelength (at $2f_0$) along coaxial circuit 3 reverses the impedance high to low or low to high impedance as is well known in the microwave art. It is then to be recognized that the high impedance presented to coaxial line 3 at coupling point C4 (FIG. 2) by cavity 22, is reflected as a short or an open circuit at diode 2. The net result of this arrangement is to provide a short or an open circuit across diode 2 at a frequency of $2f_0$. This arrangement provides control of second harmonic loading and reduces noise at output connector 18. At frequencies other than $2f_0$, cavity 22 presents a very low impedance allowing matching load 10 to characteristically terminate coaxial line 3. This provides the necessary stabilizing load at frequencies other than $f_0$ and $2f_0$ as taught by the prior art.

Figure 3:
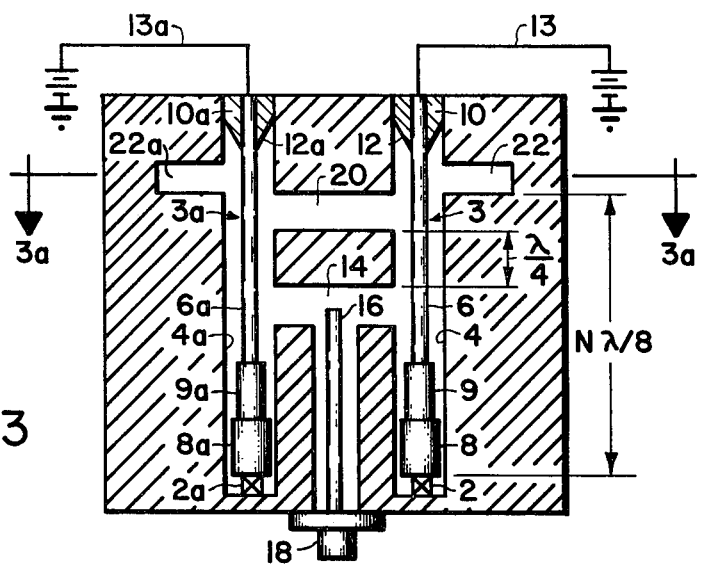
FIG. 3 is illustrative of an embodiment of the invention utilizing separate coaxial circuits for each of two diodes, FIG. 3a being a cross-sectional view of FIG. 3 illustrative of the positioning of the cavities of the invention.
Figure 3A:
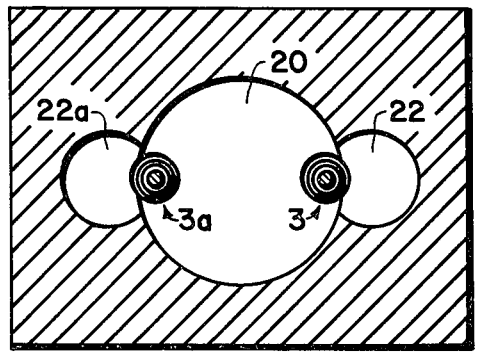

FIG. 3 represents the system of the invention utilizing 2 diodes 2, 2a. Two coaxial circuits 3, 3a are provided. As is shown in FIG. 3a, a second harmonic frequency resonant cavity 22, 22a is supplied for each of coaxial circuits 3, 3a. A single accumulator cavity 14 is coupled to both coaxial circuit 3 and coaxial circuit 3a. It will be apparent to one skilled in the art that still more coaxial circuits such as 3, 3a may be added to the configuration of FIG. 3. Each additional coaxial circuit would require the further addition of a cavity such as cavity 22, 22a, resonant at $2f_0$. Accumulator cavity 14 and second fundamental frequency cavity 20 are shared between all coaxial circuits such as coaxial circuit 3, 3a. Of course, each new coaxial circuit will require its own bias power supply. FIG. 3a is a cross-sectional view of FIG. 3 showing the relative positions of cavities 22, 22a and cavity 20 with respect to coaxial circuits 3, 3a.

One, three and six diode configurations have been built utilizing the teachings herein. Each of the circuits was operated at 12.7 GHz, a duty cycle of 5% and a pulse width of 125 nanoseconds. The single diode circuit produced 21 watts of output power, the three diode circuit produced 60 watts of output power and the six diode circuit produced 106 watts of output power. The overall d.c. to RF efficiency attained in all three cases was approximately 8.6%. This efficiency was found to be approximately 1% higher than the most optimally tuned circuits of the type utilized in the prior art. This represents an efficiency improvement of nearly 11.8%.

Various other modifications and changes may be made to the present invention from the principle of the invention described above without departing from the spirit and scope thereof as encompassed in the accompanying claims.

What is claimed is:

1. In a coaxial microwave oscillator circuit having at least one negative resistance semiconductor diode, and at least one matched terminating load wherein the at least one diode and the at least one load are positioned at opposite ends of at least one coaxial circuit and an output signal is coupled from a point intermediate the diode and the load, the improvement comprising:
    an unloaded cavity of resonant frequency, $f_0$, coupled to the at least one coaxial circuit at a point one-quarter wavelength at frequency $f_0$ from the output signal coupling points.

2. The oscillator according to claim 1 wherein the output signal is coupled to an accumulator cavity of resonant frequency $f_0$.

3. In a coaxial microwave oscillator circuit having at least one negative resistance semiconductor diode and at least one matched terminating load wherein the at least one diode and the at least one load are positioned at opposite ends of at least one coaxial circuit and an output signal is coupled from a point intermediate the diode and the load, the improvement comprising:
    an unloaded cavity of resonant frequency, $f_0$, coupled to the at least one coaxial circuits at a point one-quarter wavelength at frequency $f_0$ from the output signal coupling points; and
    at least one unloaded cavity of resonant frequency $2f_0$, each of said at least one unloaded cavities of resonant frequency $2f_0$ being coupled to the at least one coaxial circuit, respectively, at a point an integral number of one-eighth wavelengths at frequency $f_0$ from the diode.

4. The oscillator according to claim 3 wherein the output signal is coupled to an accumulator cavity of resonant frequency $f_0$.

5. In a coaxial microwave oscillator circuit having at least one negative resistance semiconductor diode and at least one matched terminating load wherein the at least one diode and the at least one load are positioned at opposite ends of at least one coaxial circuit and an output signal is coupled from a point intermediate the diode and the load, the improvement comprising:
    at least one unloaded cavity of resonant frequency $2f_0$, each of said at least one unloaded cavities of resonant frequency $2f_0$ being coupled to the at least one coaxial circuit, respectively, at a point an integral number of one-eighth wavelengths at frequency $f_0$ from the diode.

6. The oscillator according to claim 5 wherein the output signal is coupled to an accumulator cavity of resonant frequency $f_0$.

* * * * *